United States Patent
Okazaki et al.

(10) Patent No.: US 6,490,309 B1
(45) Date of Patent: *Dec. 3, 2002

(54) LASER-DIODE-PUMPED LASER APPARATUS IN WHICH PR$^{3+}$-DOPED LASER MEDIUM IS PUMPED WITH GAN-BASED COMPOUND LASER DIODE

(75) Inventors: Yoji Okazaki, Kaisei-machi (JP); Takayuki Katoh, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 64 days.

This patent is subject to a terminal disclaimer.

(21) Appl. No.: 09/621,241

(22) Filed: Jul. 21, 2000

(30) Foreign Application Priority Data

| | | | |
|---|---|---|---|
| Jul. 21, 1999 | (JP) | ............................................ | 11-206573 |
| Jul. 21, 1999 | (JP) | ............................................ | 11-206816 |
| Jul. 21, 1999 | (JP) | ............................................ | 11-206817 |

(51) Int. Cl.$^7$ ............................................ H01S 3/0941
(52) U.S. Cl. .............................. 372/75; 372/6; 372/68; 372/41
(58) Field of Search .............................. 372/75, 40, 41, 372/68, 6, 43

(56) References Cited

U.S. PATENT DOCUMENTS

| | | | | |
|---|---|---|---|---|
| 5,309,452 | A | * 5/1994 | Ohishi et al. | .................. 372/6 |
| 6,125,132 | A | 9/2000 | Okazaki | ...................... 372/75 |
| 6,333,943 | B1 | * 12/2001 | Yamamoto et al. | ........... 372/43 |

FOREIGN PATENT DOCUMENTS

| | | |
|---|---|---|
| JP | 4-318988 | 11/1992 |
| JP | 11-017266 | 1/1999 |
| JP | 11-204862 | 7/1999 |

OTHER PUBLICATIONS

Esterowitz, et al.; "Blue Light Emission by a Pr:LiYF4—Laser Operated at Room Temperature", Journal of Applied Physics, vol. 48, No. 2, Feb. 1977, pp. 650–653.

Sandrock et al.; "Efficient Continuous Wave–Laser Emission of Pr3+–Doped Fluorides at Room Temperature", Applied Phys. B58, 1994, pp. 149–151.

Buchter, et al. "All Solid State Red, Green, and Blue Pr: YLF Laser", Optical Society of America Tops vol. 19, pp. 34–35, 1998.

Clarkson, et al., "Visible and UV Sources", Technical Digest of CLEO 9.

(List continued on next page.)

Primary Examiner—Paul Ip
Assistant Examiner—James Menefee
(74) Attorney, Agent, or Firm—Stroock & Stroock & Lavan LLP

(57) ABSTRACT

In a laser-diode-pumped laser apparatus, a solid-state laser crystal doped with at least one rare-earth element including at least Pr$^{3+}$ is pumped with a laser diode, and emits laser light. In the first aspect, the laser diode has an active layer made of one of an InGaN, InGaNAs, and GaNAs materials, and an optical wavelength conversion element converts the solid-state laser light into ultraviolet laser light by wavelength conversion. In the second aspect, the solid-state laser crystal is codoped with Pr$^{3+}$ and at least one of Er$^{3+}$, Ho$^{3+}$, Dy$^{3+}$, Eu$^{3+}$, Sm$^{3+}$, Pm$^{3+}$, and Nd$^{3+}$. In the third aspect, instead of the solid-state laser crystal, an optical fiber codoped with Pr$^{3+}$ and at least one of Er$^{3+}$, Ho$^{3+}$, Dy$^{3+}$, Eu$^{3+}$, Sm$^{3+}$, Pm$^{3+}$, and Nd$^{3+}$ is pumped with a GaN-based compound laser diode. In the fourth aspect, an optical fiber codoped with Pr$^{3+}$ and at least one of Er$^{3+}$, Ho$^{3+}$, Dy$^{3+}$, Eu$^{3+}$, Sm$^3$, Pm$^3$, and Nd$^{3+}$ amplifies incident light having a wavelength which is identical with a wavelength of fluorescence generated by pumping of the optical fiber with a GaN-based compound laser diode.

28 Claims, 5 Drawing Sheets

OTHER PUBLICATIONS

Smart, et al., "CW Room Temperature Operation of Praseodymium–doped Fluorozirconate Glass Fibre Lasers in teh Blue–Green, Green and Red Spectral Regions", Optics Communications 86, 1991, pp. 333–340.

Ishikawa et al., "Rare Earth Doped Fiber for Optical Amplifiers Operating Around 1.3um", The Institute of Electronics, Information and Communication Engineers, pp. 83–89.

* cited by examiner

LASER-DIODE-PUMPED LASER APPARATUS IN WHICH PR³⁺-DOPED LASER MEDIUM IS PUMPED WITH GAN-BASED COMPOUND LASER DIODE

BACKGROUND OF THE INVENTION

1. Field of the Invention

The present invention relates to a laser-diode-pumped solid-state laser apparatus. The present invention also relates to a laser-diode-pumped fiber laser apparatus. The present invention further relates to a laser-diode-pumped fiber laser amplifier.

2. Description of the Related Art (1) Ultraviolet Laser

Highly efficient, high output power ultraviolet lasers which continuously oscillate in the ultraviolet wavelength range are required, for example, for applications in ultraviolet lithography, fluorometric analysis of organic cells, and the like. GaN-based compound semiconductor lasers having an active layer made of an InGaN, InGaNAs, or GaNAs material are known as lasers which oscillate in the ultraviolet wavelength range. Recently, GaN-based compound semiconductor lasers which can continuously oscillate for a thousand hours at the wavelength of 400 nm with output power of several milliwatts are provided.

However, the current GaN-based compound semiconductor lasers cannot emit laser light with output power of 100 mW or more by a single transverse mode, which is required in many applications. In addition, the oscillation efficiency in the current GaN-based compound semiconductor lasers which emit laser light having wavelengths of 380 nm or below is low, and the lifetimes of such semiconductor lasers are very short.

On the other hand, wavelength-conversion solid-state lasers which output ultraviolet laser beams having wavelengths of 400 nm or below are known. In these wavelength-conversion solid-state lasers, wavelengths of laser oscillation light are shortened to the ultraviolet wavelengths by second harmonic generation (SHG) or third harmonic generation (THG) using nonlinear optical crystals.

However, solid-state laser mediums which can efficiently oscillate in the wavelength range of 700 to 800 nm have not yet been found. Therefore, it is difficult to obtain high output power from the wavelength-conversion solid-state lasers in which the wavelengths of the laser light are shortened by second harmonic generation (SHG).

In addition, the efficiency of the wavelength-conversion solid-state lasers in which the wavelengths of the laser light are shortened by third harmonic generation (THG) is essentially low, and the current THG wavelength-conversion solid-state lasers can oscillate in only a pulse mode. In order to realize continuous oscillation, it is necessary to maintain resonance of SHG light of the fundamental wave, and highly accurate temperature adjustment of a resonator with a precision of 0.01iC is required for oscillation of the THG light. However, such accurate temperature adjustment is practically difficult in terms of cost.

(2) Blue and Green Lasers

Gas-laser-pumped solid-state laser apparatuses in which a Pr³⁺-doped solid-state laser crystal is pumped with a gas laser such as an Ar laser are known as disclosed in Journal of Applied Physics, vol. 48, No. 2, pp.650–653 (1977), and Applied Physics, B58, pp.149–151 (1994). In addition, a solid-state laser apparatus in which a Pr³⁺-doped solid-state laser crystal is pumped by second harmonic (SH) light from a lamp-pumped solid-state laser is known, as disclosed in "Advanced Solid-State Laser," OSA TOPS, vol.19, pp.34–35, the Optical Society of America, 1998. In these solid-state laser apparatuses, it is possible to generate a laser beam in a blue wavelength range of 470 to 490 nm by a transition from $^3P_0$ to $^3H_4$. It is also possible to generate a laser beam in a green wavelength range of 520 to 550 nm by a transition from $^3P_1$ to $^3H_1$. Therefore, the above solid-state laser apparatuses can be used as a light source for recording a color image in a color sensitive material.

The light sources for use in recording a color image in a color sensitive material are required to be small in size, light in weight, and inexpensive. However, the above gas-laser-pumped and lamp-pumped solid-state laser apparatuses using the Pr³⁺-doped solid-state laser crystals are not suitable for use in recording a color image in a color sensitive material since the pumping light sources in these solid-state laser apparatuses are large, heavy, and expensive.

In addition, a solid-state laser apparatus in which a Pr³⁺-doped solid-state laser crystal is pumped by a blue laser beam emitted from an SHG laser apparatus is known as disclosed by Andy Clarkson, "Visible and UV Sources," Technical Digest of CLEO '99, University of Southampton, 1999.

However, the above SHG-pumped solid-state laser apparatuses using the Pr³⁺-doped solid-state laser crystals are also not suitable for use in recording a color image in a color sensitive material since the pumping light sources in the SHG-pumped solid-state lasers are large, heavy, and expensive.

As another solid-state laser apparatus which emits a laser beam having a wavelength in the blue or green wavelength range, Japanese Unexamined Patent Publication No. 4(1992)-318988 discloses a laser-diode-pumped SHG laser apparatus in which a solid-state laser beam is converted into a second harmonic, i.e., the wavelength of the solid-state laser beam is reduced by half by arranging a nonlinear optical crystal in a resonator.

However, the efficiency of wavelength conversion in the current laser-diode-pumped SHG laser apparatuses in which a wavelength of a solid-state laser beam is reduced by using a nonlinear optical crystal is not sufficiently high, and therefore it is difficult to obtain high output power. In addition, in such laser-diode-pumped SHG laser apparatuses, an etalon or the like is inserted for limiting the oscillation mode to a single mode. Therefore, loss in the resonator is great, and thus achievement of high output power becomes more difficult. Further, in order to match phases in the wavelength conversion, highly accurate temperature control is required, and therefore the outputs of the laser-diode-pumped SHG laser apparatuses are not stable. Moreover, since the numbers of parts are increased by the provision of the nonlinear optical crystal and the etalon, the laser-diode-pumped SHG laser apparatuses are expensive.

Recently, InGaN-based compound laser diodes and ZnMgSSe-based compound laser diodes which emit laser beams in the blue and green wavelength ranges have been developed.

Since, the oscillation wavelengths of the InGaN-based compound laser diodes increase with increase in the indium content, theoretically it is possible to obtain laser beams in the blue wavelength range of 470 to 490 nm, or laser beams in the green wavelength range of 520 to 550 nm. However, since the quality of the crystal deteriorates with the increase in the indium content, it is practically impossible to sufficiently increase the indium content, and the upper limit of the lengthened wavelength is about 450 nm.

In addition, blue light can be obtained by laser diodes having an active layer made of an InGaNAs or GaNAs material. The oscillation wavelengths in these laser diodes can also be increased by doping the active layer with arsenic. However, since the quality of the crystal deteriorates with the increase in the arsenic content, the upper limit of the wavelength realizing high output power is about 450 to 460 nm.

Further, the current ZnMgSSe-based compound laser diodes cannot oscillate continuously at wavelengths below 500 nm at room temperature, and the lifetimes are at most a hundred hours.

Japanese Unexamined Patent Publication No. 11(1999)-17266, which is assigned to the present assignee, discloses a laser-diode-pumped solid-state laser apparatus which is inexpensive, and can emit a laser beam in the blue or green wavelength range with high efficiency, high output power, and high output stability. In this laser-diode-pumped solid-state laser apparatus, a $Pr^{3+}$-doped solid-state laser crystal is pumped with an InGaN-based compound laser diode having an active layer made of an InGaN-based compound, or an InGaNAs-based compound laser diode having an active layer made of an InGaNAs-based compound, or a GaNAs-based compound laser diode having an active layer made of a GaNAs-based compound. However, in the above laser-diode-pumped solid-state laser apparatus, the amount of the pumping light absorbed by the $Pr^{3+}$-doped solid-state laser crystal is not sufficient.

(3) Fiber Lasers

As disclosed in the Technical Report of the Institute of Electronics, information and Communication Engineers in Japan, LQE95-30 (1995) p.30, and Optics Communications 86 (1991) p.337, laser-diode-pumped fiber laser apparatuses in which an optical fiber having a core made of a $Pr^{3+}$-doped fluoride is pumped with a laser diode so as to generate a laser beam are known.

In addition, the above references also disclose an optical fiber amplifier in which an optical fiber having a $Pr^{3+}$-doped core is pumped with a laser diode so as to generate fluorescent light, and incident light of the optical fiber is amplified by the energy of the fluorescent light when the wavelength of the incident light is included in the wavelength range of the fluorescent light.

Besides, an Ar-laser-pumped, $Pr^{3+}$-doped fiber laser apparatus is also disclosed in Optics Communications 86 (1991) p.337, which reports laser oscillations at the wavelengths of 491, 520, 605, and 635 nm with pumping light having a wavelength of 476.5 nm.

Further, Japanese Patent Application No. 9(1997)-110554, which is assigned to the present assignee, discloses a laser-diode-pumped solid-state laser apparatus in which a $Pr^{3+}$-doped solid-state laser crystal is pumped with a laser diode.

The above laser-diode-pumped fiber laser apparatuses, Ar-laser-pumped, $Pr^{3+}$-doped fiber laser apparatus, and laser-diode-pumped solid-state laser apparatus can emit blue or green laser beams, and the above optical fiber amplifier can amplify blue or green laser beams. In this respect, it is considered that these apparatuses may be used as constituents of light sources for recording a color image in a color sensitive material.

However, a water cooling system is required for operating the Ar-laser-pumped, $Pr^{3+}$-doped fiber laser apparatus with high power of a few watts to several tens of watts. Therefore, the size is increased, and the lifetime and the efficiency are reduced.

On the other hand, since the laser-diode-pumped solid-state laser apparatuses in which a $Pr^{3+}$-doped solid-state laser crystal is pumped with a laser diode has such structure that thermal energy of pumping light is concentrated in a small solid-state laser crystal, absorption of the thermal energy by the crystal causes heat generation and a thermal lens effect. Therefore, beam quality and output stability deteriorate. In particular, the deterioration is serious in the operation with high power of a few watts to several tens of watts.

Japanese Unexamined Patent Publication No. 11(1999)-204862, which is assigned to the present assignee, discloses a fiber laser apparatus which can be realized in a small size, and can emit a blue or green laser beam with high efficiency, high output power, and highly stable quality and output level. In this fiber laser apparatus, an optical fiber having a $Pr^{3+}$-doped core is pumped with a GaNAs-based compound laser diode.

In addition, JPP No. 11-204862 also discloses a fiber laser amplifier which can be realized in a small size, and can amplify a blue or green laser beam with high efficiency and highly stable quality and output level. In this fiber laser amplifier, a first optical fiber having a $Pr^{3+}$-doped core is pumped with a GaNAs-based compound laser diode so as to generate fluorescent light, and incident light of the optical fiber is amplified by the energy of the fluorescent light when the wavelength of the incident light is included in the wavelength range of the fluorescent light.

However, in the above fiber laser apparatus and fiber laser amplifier disclosed in JPP No. 11-204862, the amount of the pumping light absorbed by the fiber core is insufficient.

SUMMARY OF THE INVENTION

An object of the present invention is to provide a semiconductor-laser-pumped solid-state laser apparatus, which can continuously emit ultraviolet laser light having the wavelengths of about 360 nm or below with high efficiency and high output power, and can be produced at low cost.

Another object of the present invention is to provide a laser-diode-pumped solid-state laser apparatus, in which a solid-state laser crystal is pumped with a laser diode having an active layer made of an InGaN, InGaNAs, or GaNAs material, an amount of pumping light absorbed by the solid-state laser crystal is increased, and high efficiency and high output power are achieved.

Still another object of the present invention is to provide a fiber laser apparatus, in which a solid-state laser crystal is pumped with a GaN-based compound laser diode, an amount of pumping light absorbed by a fiber core is increased, and high efficiency and high output power are achieved.

A further object of the present invention is to provide a fiber laser amplifier, in which a solid-state laser crystal is pumped with a GaN-based compound laser diode, an amount of pumping light absorbed by a fiber core is increased, and a high amplifier gain is achieved.

(1) According to the first aspect of the present invention, there is provided a laser-diode-pumped solid-state laser apparatus including a laser diode which has an active layer made of one of an InGaN, InGaNAs, and GaNAs materials, and emits a pumping laser beam; a solid-state laser crystal which is doped with at least one rare-earth element including at least $Pr^{3+}$, and emits solid-state laser light when the solid-state laser crystal is pumped by the pumping laser beam; and an optical wavelength conversion element which converts the solid-state laser light into ultraviolet laser light by wavelength conversion.

Preferably, the laser-diode-pumped solid-state laser apparatus according to the first aspect of the present invention may also have one or any possible combination of the following additional features (i) to (iii).

(i) The solid-state laser crystal may be codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$.

(ii) The solid-state laser crystal may emit a solid-state laser beam having a wavelength of about 720 nm by a transition from $^3P_0$ to $^3F_4$ in the solid-state laser crystal, and the ultraviolet light may be a second harmonic of the solid-state laser light, and have a wavelength of about 360 nm.

(iii) The optical wavelength conversion element may be made of a nonlinear optical crystal having periodic domain-inverted structure.

When a $Pr^{3+}$-doped solid-state laser crystal such as a $Pr^{3+}$:YLF crystal is pumped with a GaN-based compound laser diode, the $Pr^{3+}$-doped solid-state laser crystal efficiently oscillates in the wavelength range of 700 to 800 nm. For example, the $Pr^{3+}$-doped solid-state laser crystal efficiently emits a solid-state laser beam having the wavelength of 720 nm by a transition from 3 to $^3F_4$, where the wavelength of 720 nm corresponds to an oscillation peak of $Pr^{3+}$ in the infrared range. In this case, high intensity ultraviolet light having the wavelength of 360 nm is obtained by wavelength conversion of the solid-state laser beam having the wavelength of 720 nm into a second harmonic by using an optical wavelength conversion element.

In addition, it is relatively easy for the GaN-based compound laser diodes to emit laser beams in the wavelength range of 380 to 430 nm, and each of the dopants, $Er^{3+}$, $Ho^{3+}$, $Dy^{3+}$, $Eu^{3+}$, $Sm^{3+}$, $Pm^{3+}$, and $Nd^{3+}$, has an absorption band in the wavelength range of 380 to 430 nm. Therefore, these dopants can be pumped with the GaN-based compound laser diodes. In the solid-state laser crystal codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, the excited electrons can move to an excitation level (e.g., $^3P_0$ to $^3P_1$) of $Pr^{3+}$. Then, the solid-state laser crystal can emit a solid-state laser beam corresponding to an oscillation peak of $Pr^{3+}$, i.e., corresponding to a transition between two energy levels of $Pr^{3+}$. For example, the solid-state laser crystal can emit a solid-state laser beam having the wavelength of 720 nm by a transition from $^3P_0$ to $^3F_4$, or the like. In this case, high intensity ultraviolet light having the wavelength of 360 nm can be obtained by wavelength conversion of the solid-state laser beam having the wavelength of 720 nm into a second harmonic by using an optical wavelength conversion element.

As mentioned above, it is relatively easy for the GaN-based compound laser diodes to emit laser beams in the wavelength range of 380 to 430 nm. In particular, in the wavelength range of 400 to 410 nm, the output power of the currently available GaN-based compound laser diode is maximized. Therefore, since $Er^{3+}$, $Ho^{3+}$, $Dy^{3+}$, $Eu^{3+}$, $Sm^{3+}$, $Pm^{3+}$, and $Nd^{3+}$ are pumped with the GaN-based compound laser diodes, the absorbed amount of the pumping light is increased, and thus high efficiency and high output power can be achieved.

In particular, when the optical wavelength conversion element performs wavelength conversion into a second harmonic, the construction for performing the wavelength conversion can be simplified, compared with the construction of wavelength conversion into a third harmonic, and therefore a laser-diode-pumped solid-state laser apparatus can be realized at low cost.

In addition, the thermoconductivity of the GaN-based compound laser diodes is very great (i.e., about 130 W/m° C.), compared with the thermoconductivity of the other laser diodes such as ZnMgSSe-based compound laser diodes (which have thermoconductivity of 4 W/m° C.). Further, since the dislocation mobility of the GaN-based compound laser diodes is very low, compared with that of ZnMgSSe-based compound laser diodes, the COD (catastrophic optical damage) thresholds of the GaN-based compound laser diodes are very high. Therefore, it is easy to achieve a long lifetime and high output power. Since the laser-diode-pumped solid-state laser apparatus according to the first aspect of the present invention uses a GaN-based compound laser diode as a pumping light source, the laser-diode-pumped solid-state laser apparatus can also have a long lifetime, and emit an ultraviolet laser beam with high output power.

(2) According to the second aspect of the present invention, there is provided a laser-diode-pumped solid-state laser apparatus including a laser diode which has an active layer made of one of an InGaN, InGaNAs, and GaNAs materials, and emits a pumping laser beam; and a solid-state laser crystal which is codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, and emits solid-state laser light when the solid-state laser crystal is pumped by the pumping laser beam.

Preferably, the laser-diode-pumped solid-state laser apparatus according to the second aspect of the present invention may also have one or any possible combination of the following additional features (iv) to (vi)(iv)

The solid-state laser light may have a blue wavelength in a range of 465 to 495 nm.

(v) The solid-state laser light may have a green wavelength in a range of 515 to 555 nm.

(vi) The solid-state laser light may have a red wavelength in a range of 600 to 660 nm.

Since each of the dopants, $Er^{3+}$, $Ho^{3+}$, $Dy^{3+}$, $Eu^{3+}$, $Sm^{3+}$, $Pm^{3+}$, and $Nd^{3+}$, has an absorption band in the wavelength range of 380 to 430 nm, these dopants can be pumped with the GaN-based compound laser diodes. Therefore, in the solid-state laser crystal codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, the excited electrons can move to excitation levels (e.g., $^3P_0$ to $^3P_1$) of $Pr^{3+}$, and the solid-state laser crystal can emit blue, green, and red laser beams corresponding to oscillation peaks of $Pr^{3+}$ by transitions between the energy levels of $Pr^{3+}$.

As mentioned before, it is relatively easy for the GaN-based compound laser diodes to emit laser beams in the wavelength range of 380 to 430 nm. In particular, in the wavelength range of 400 to 410 nm, the output power of the currently available GaN-based compound laser diodes is maximized. Therefore, since $Er^{3+}$, $Ho^{3+}$, $Dy^{3+}$, $Eu^{3+}$, $Sm^{3+}$, $Pm^{3+}$, and $Nd^{3+}$ are pumped with the GaN-based compound laser diodes, the absorbed amount of the pumping light is increased, and thus high efficiency and high output power can be achieved.

In addition, for the same reasons as explained for the first aspect of the present invention, the laser-diode-pumped solid-state laser apparatus according to the second aspect of the present invention can have a long lifetime, and emit a laser beam in the blue and green wavelength ranges with high output power.

The GaN-based compound laser diodes used as a pumping light source may be a single longitudinal or transverse mode, broad-area, phased-array, or MOPA (master oscillator power amplifier) type high power laser diode. In addition, one or more GaN-based compound laser diodes may be used in a laser-diode-pumped solid-state laser apparatus. Thus, the laser-diode-pumped solid-state laser apparatus according to the second aspect of the present invention can emit a laser beam with an even higher output power, e.g., in the order of 1 W.

In addition, since the laser-diode-pumped solid-state laser apparatus according to the second aspect of the present invention does not require a nonlinear optical crystal, an etalon or the like, the number of constituents of the laser-diode-pumped solid-state laser apparatus is small, i.e., the construction of the laser-diode-pumped solid-state laser apparatus can be simplified, and the operation is stable in a wide temperature range. Therefore, the laser-diode-pumped solid-state laser apparatus according to the second aspect of the present invention can be used as a stable and inexpensive pumping light source.

Further, since the laser-diode-pumped solid-state laser apparatus according to the second aspect of the present invention does not perform wavelength conversion, highly accurate temperature control for phase matching is unnecessary. Therefore, it is possible to avoid the output instability due to the temperature control, i.e., high output stability can be achieved. (3) According to the third aspect of the present invention, there is provided a fiber laser apparatus including a GaN-based compound laser diode which emits a pumping laser beam; and an optical fiber which is codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, and emits laser light when the optical fiber is pumped by the pumping laser beam.

Preferably, the fiber laser apparatus according to the third aspect of the present invention may also have one or any possible combination of the following additional features (vii) to (x).

(vii) The laser light may have a blue wavelength in a range of 465 to 495 nm.

(viii) The laser light may have a green wavelength in a range of 515 to 555 nm.

(ix) The laser light may have a red wavelength in a range of 600 to 660 nm.

(x) The GaN-based compound laser diode may have an active layer made of one of an InGaN, InGaNAs, and GaNAs materials.

The fiber laser apparatus according to the third aspect of the present invention has basically the same advantages as the laser-diode-pumped solid-state laser apparatus according to the second aspect of the present invention.

(4) According to the fourth aspect of the present invention, there is provided a fiber laser amplifier including a GaN-based compound laser diode which emits a pumping laser beam; and an optical fiber which is codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, generates fluorescence with at least one wavelength when the optical fiber is pumped by the pumping laser beam, and amplifies incident light which has a wavelength included in the at least one wavelength of the fluorescence.

Preferably, the fiber laser amplifier according to the fourth aspect of the present invention may also have one or any possible combination of the following additional features (xi) to (xiv).

(xi) The fluorescence may have a blue wavelength in a range of 465 to 495 nm.

(xii) The fluorescence may have a green wavelength in a range of 515 to 555 nm.

(xiii) The fluorescence may have a red wavelength in a range of 600 to 660 nm.

(xiv) The GaN-based compound laser diode may have an active layer made of one of an InGaN, InGaNAs, and GaNAs materials.

The fiber laser amplifier according to the fourth aspect of the present invention has basically the same advantages as laser-diode-pumped solid-state laser apparatus according to the second aspect of the present invention.

DESCRIPTION OF PREFERRED EMBODIMENTS

Embodiments of the present invention are explained in detail below with reference to drawings.

First Embodiment

Figure 1:
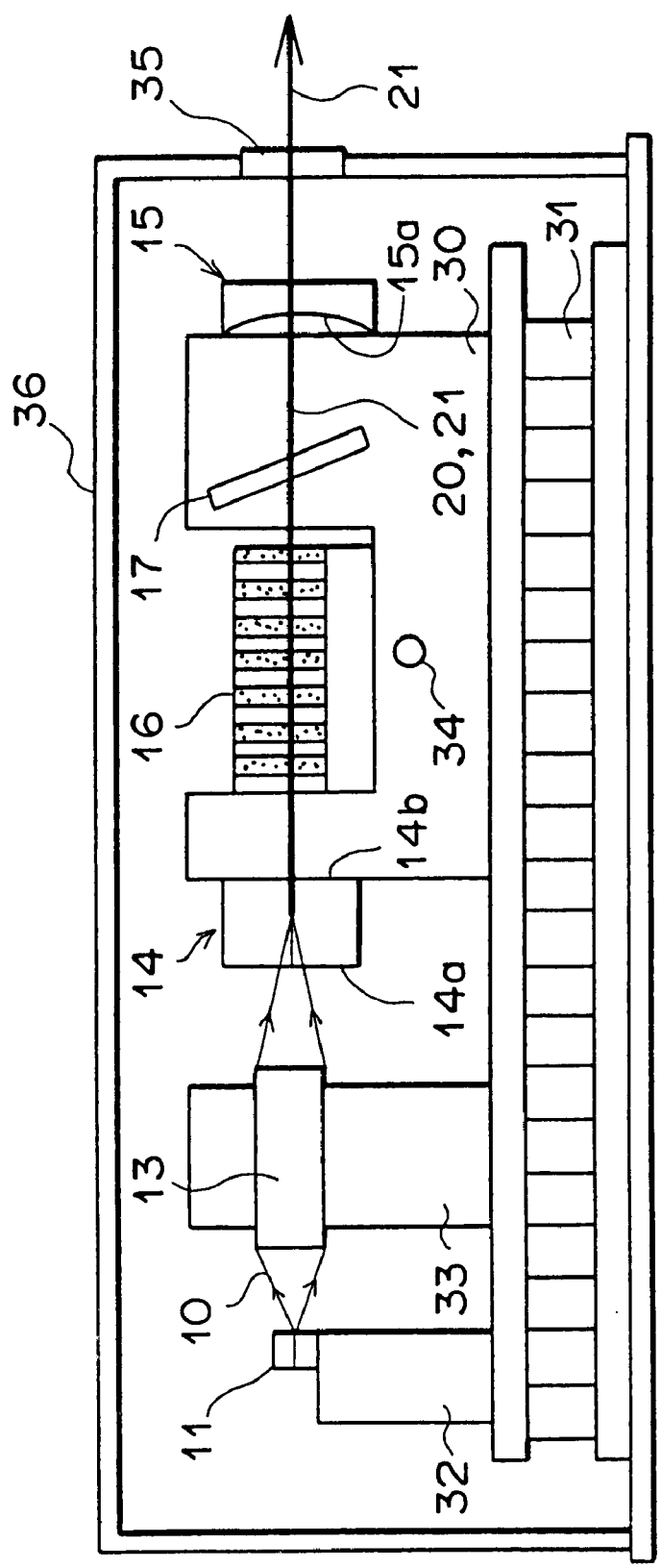
FIG. 1 is a side view illustrating an outline of the construction of the laser-diode-pumped solid-state laser apparatus as a first embodiment of the present invention.

FIG. 1 is a side view illustrating an outline of the construction of the laser-diode-pumped solid-state laser apparatus as the first embodiment of the present invention.

The laser-diode-pumped solid-state laser apparatus of FIG. 1 comprises a laser diode 11, a condenser lens 13, a solid-state laser medium 14, a resonator mirror 15, an optical wavelength conversion element 16, and an etalon 17. The laser diode 11 emits a laser beam 10 as pumping light, where the laser beam 10 is a divergent light beam. The condenser lens 13 is realized by, for example, an index distribution type lens, and condenses the laser beam 10. The solid-state laser medium 14 is a $Pr^{3+}$-doped $LiYF_4$ crystal (hereinafter referred to as Pr:YLF crystal). The resonator mirror 15 is arranged on the forward side (i.e., on the right side in FIG. 1) of the Pr:YLF crystal 14. The optical wavelength conversion element 16 and the etalon 17 are arranged between the Pr:YLF crystal 14 and the resonator mirror 15.

The above elements 14 to 17 are arranged on a common mount 30, which is made of, for example, copper. The mount 30 is fixed on a Peltier element 31, which functions as a temperature adjustment means. The laser diode 11 and the condenser lenses 13 are respectively arranged on mounts 32 and 33, which are made of, for example, copper. The mounts 32 and 33 are also fixed on the Peltier element 31. The Peltier element 31 is contained in a sealed case 36, which has a light exit window 35.

The operation of the Peltier element 31 is controlled by a temperature control circuit (not shown) based on a temperature detection signal which is output from a thermistor 34 attached to the mount 30, so that the laser diode 11 and all of the elements constituting a solid-state laser resonator are maintained at a predetermined temperature, where the solid-state laser resonator is constituted by the Pr:YLF crystal 14 and the resonator mirror 15.

The optical wavelength conversion element 16 is produced by forming periodic domain-inverted structure in a MgO-doped $LiNbO_3$ crystal, which is a nonlinear optical material. In this example, the period of the periodic domain-inverted structure is 1.65 micrometers, which realizes a first order period for the wavelength (720 nm) of the fundamental harmonic and the wavelength (360 nm) of the second harmonic. The etalon 17 functions as a wavelength selection element for realizing a single longitudinal mode oscillation of the solid-state laser and reducing noise.

The laser diode 11 in the construction of FIG. 1 is a broad-area type semiconductor laser device, which has an InGaN active layer, and oscillates at the wavelength of 450 nm.

The backward end surface 14a of the Pr:YLF crystal 14 is a light entrance plane, and is coated so as to have the following transmittance and reflectances. The transmittance of the backward end surface 14a at the wavelength of 450 nm is 80% or higher, so that light having the wavelength of 450 nm efficiently transmits through the backward end surface 14a. In addition, the reflectance of the backward end surface 14a at the wavelength of 720 nm is high, where the wavelength of 720 nm corresponds to one of the oscillation peaks of Pr For example, the reflectance of the backward end surface 14a at the wavelength of 720 nm is 99% or higher, and preferably 99.9% or higher. Further, the reflectances of the backward end surface 14a at the wavelengths of the other oscillation peaks of $Pr^{3+}$ (i.e., in the wavelength ranges of 490 to 650 nm, and 800 nm and more) are low. For example, the reflectances in the wavelength ranges of 490 to 650 nm, and 800 nm and more are 60% or lower, and preferably 30% or lower.

The forward end surface 14b of the Pr:YLF crystal 14 is coated so as to have a low reflectance (e.g., 0.2% or lower) at the wavelength of 720 nm, and a high reflectance (e.g., 95% or higher) at the wavelength of 360 nm, where the wavelength of 360 nm corresponds to the second harmonic of the fundamental wave of 720 nm.

The mirror surface 15a of the resonator mirror 15 is coated so as to have a high reflectance (e.g., 99% or higher, and preferably 99.9% or higher) at the wavelength of 720 nm, a transmittance of 95% at the wavelength of 360 nm, and low reflectances (e.g., 60% or lower, and preferably 30% or lower) in the wavelength ranges of 490 to 650 nm, and 800 nm and more.

The laser beam 10 emitted from the laser diode 11 has a wavelength of 450 nm, and enters the Pr:YLF crystal 14 through the backward end surface 14a. Since $Pr^{3+}$ in the Pr:YLF crystal 14 is pumped by the laser beam 10, the Pr:YLF crystal 14 generates light having the wavelength of 720 nm, which is considered to be generated by a transition from $^3P_0$ to $^3F_4$. Then, laser oscillation at the wavelength of 720 nm occurs in a resonator which is constituted by the backward end surface 14a of the Pr:YLF crystal 14 and the mirror surface 15a of the resonator mirror 15, and a solid-state laser beam 20 having the wavelength of 720 nm is generated. The solid-state laser beam 20 enters the optical wavelength conversion element 16, and is converted to a second harmonic 21 having the wavelength of 360 nm, which is one-half of the wavelength of the solid-state laser beam 20.

Since the mirror surface 15a of the resonator mirror 15 is coated as described before, only the second harmonic 21 exits through the resonator mirror 15. Thus, the second harmonic 21 exits from the sealed case 36 through the light exit window 35.

Since, in the laser-diode-pumped solid-state laser apparatus as the first embodiment of the present invention, the Pr:YLF crystal 14 is pumped with the InGaN laser diode, the efficiency and the output power are enhanced for the reason explained before. Actually, the applicant has obtained 100 mW as the output power of the second harmonic 21 when the output power of the laser diode 11 is 2 W in the continuous wave (CW) operation as described above.

The efficiency of the wavelength conversion can be enhanced by inserting a Q switch element into the resonator, although, in this case, the laser-diode-pumped solid-state laser apparatus operates in a pulse mode. In this case, the applicant has obtained 500 mW as the output power of the second harmonic 21 when the output power of the laser diode 11 is 2 W. Since the COD (catastrophic optical damage) thresholds of the GaN-based compound laser diodes are high, pulsed ultraviolet light can be obtained with high efficiency and high output power by driving the pumping laser diode in a pulse mode.

Second Embodiment

Figure 2:
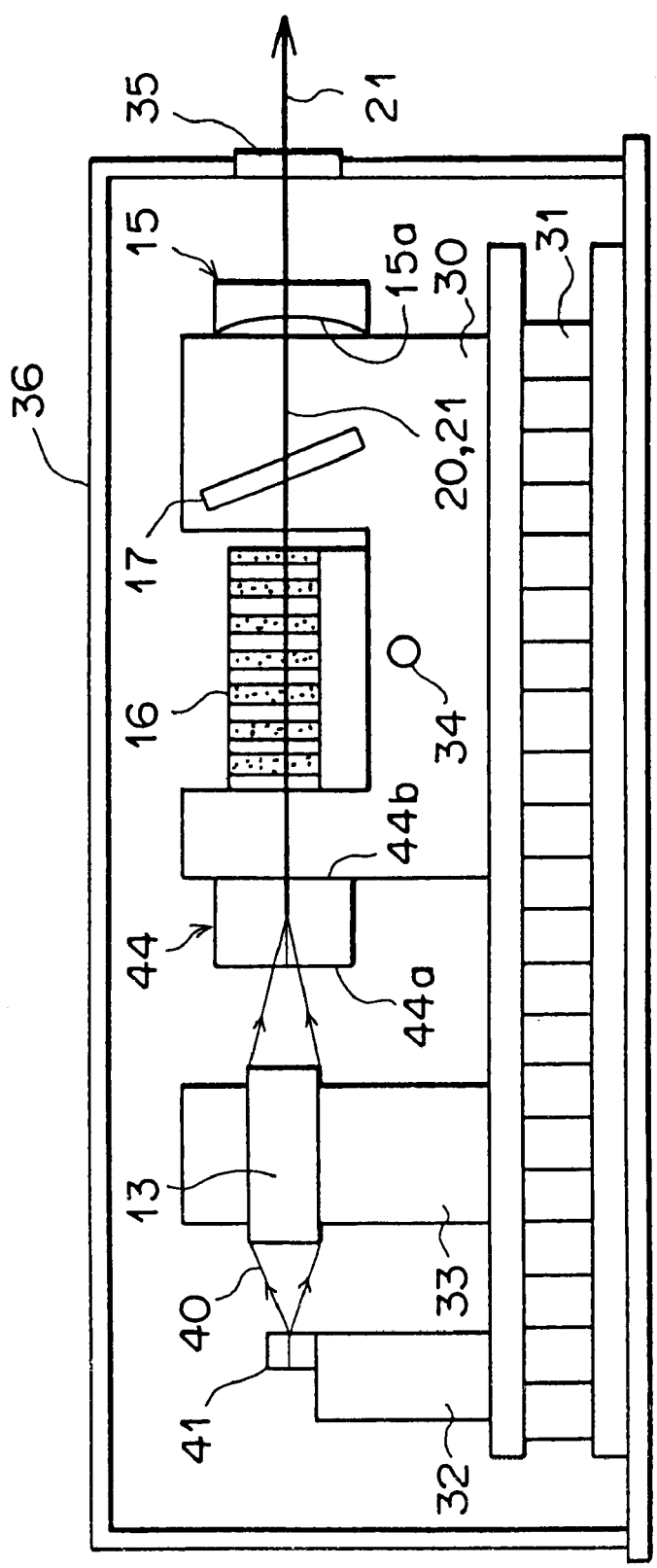
FIG. 2 is a side view illustrating an outline of the construction of the laser-diode-pumped solid-state laser apparatus as a second embodiment of the present invention.

FIG. 2 is a side view illustrating an outline of the construction of the laser-diode-pumped solid-state laser apparatus as the second embodiment of the present invention. In FIG. 2, elements having the same reference numbers as FIG. 1 have the same functions as the corresponding elements in FIG. 1.

The construction of FIG. 2 is different, from the construction of FIG. 1, in that a $Pr^{3+}$-and-$Er^{3+}$-codoped $LiYF_4$ crystal (hereinafter referred to as $Pr^{3+}:Er^{3+}:YLF$ crystal) 44 is used instead of the Pr:YLF crystal 14, and the wavelength of a laser beam 40 emitted from the broad-area type InGaN laser diode 41 is 400 nm, while the wavelength of the laser beam 10 emitted from the broad-area type InGaN laser diode 11 in FIG. 1 is 450 nm.

The backward end surface 44a of the $Pr^{3+}:Er^{3+}:YLF$ crystal 44 is a light entrance plane, and is coated so as to have a high transmittance (i.e., 80% or higher) at the wavelength of 400 nm, and efficiently pass therethrough the light beam 40 from the laser diode 41. In addition, the reflectance of the backward end surface 44a at the wavelength of 720 nm is high, e.g., the reflectance of the backward end surface 44a at the wavelength of 720 nm is 99% or higher, and preferably 99.9% or higher. Further, the reflectances of the backward end surface 44a at the wavelengths of the other oscillation peaks of $Pr^{3+}$ (i.e., in the wavelength ranges of 490 to 650 nm, and 800 nm and more) are low. For example, the reflectances in the wavelength ranges of 490 to 650 nm, and 800 nm and more, are 60% or lower, and preferably 30% or lower.

The forward end surface 44b of the $Pr^{3+}:Er^{3+}:YLF$ crystal 44 is coated so as to have a low reflectance (e.g., 0.2% or lower) at the wavelength of 720 nm, and a high reflectance (e.g., 95% or higher) at the second harmonic wavelength of 360 nm.

The mirror surface 15a of the resonator mirror 15 is coated so as to have a high reflectance (e.g., 99% or higher, and preferably 99.9% or higher) at the wavelength of 720 nm, a transmittance of 95% at the wavelength of 360 nm, and low reflectances (e.g., 60% or lower, and preferably 30% or lower) in the wavelength ranges of 490 to 650 nm, and 800 nm and more.

The laser beam 40 emitted from the laser diode 41, has a wavelength of 400 nm, and enters the $Pr^{3+}:Er^{3+}:YLF$ crystal 44 through the backward end surface 44a. In the $Pr^{3+}:Er^{3+}:YLF$ crystal 44, $Er^{3+}$ is pumped by the laser beam 40, and the excited electrons move to excited levels of $Pr^{3+}$. Thus, the $Pr^{3+}:Er^{3+}:YLF$ crystal 44 generates light having wavelengths corresponding to transitions between energy levels of $Pr^{3+}$, and the wavelengths of the generated light includes the wavelength of 720 nm, which is considered to be generated by a transition from $^3P_0$ to $^3F_4$. In this embodiment, laser oscillation at the wavelength of 720 nm occurs in a resonator which is constituted by the backward end surface 44a of the $Pr^{3+}:Er^{3+}:YLF$ crystal 44 and the mirror surface 15a of the resonator mirror 15, and a solid-state laser beam 20' having the wavelength of 720 nm is generated. The solid-state laser beam 20' enters the optical wavelength conversion element 16, and is converted to a second harmonic 21' having the wavelength of 360 nm, which is one-half of the wavelength of the solid-state laser beam 20'. Since the mirror surface 15a of the resonator mirror 15 is coated as described before, only the second harmonic 21' exits through the resonator mirror 15. Thus, the second harmonic 21' exits from the sealed case 36 through the light exit window 35.

Since, in the laser-diode-pumped solid-state laser apparatus as the second embodiment of the present invention, the $Pr^{3+}:Er^{3+}:YLF$ crystal 44 is pumped with the InGaN laser diode, the efficiency and the output power are enhanced for the reason explained before. Actually, the applicant has obtained 100 mW as the output power of the second harmonic 21' when the output power of the laser diode 41 is 2 W in the construction of FIG. 2.

Variations of First and Second Embodiments

Although the active layers of the laser diodes in the constructions of FIGS. 1 and 2 are made of InGaN materials, instead, laser diodes having an active layer made of an InGaNAs-based or GaNAs-based compound material may be used as the pumping light source. In particular, when an absorption band of a solid-state laser crystal is located on the longer wavelength side of the output wavelength of the laser diode, it is preferable to use the InGaNAs-based or GaNAs-based compound material as the active layer of the laser diode, since the wavelength of the laser oscillation in the InGaNAs-based or GaNAs-based compound laser diode can be lengthened more easily than that in the InGaN-based laser diode. Thus, the absorption efficiency can be enhanced by use of the InGaNAs-based or GaNAs-based compound laser diode.

Although the solid-state laser crystals in the constructions of FIGS. 1 and 2 are YLF crystals, instead, $BaY_2F_8$, $Ba(Y, Yb)_2F_8$, $LaF_3$, $Ca(NbO_3)_2$, $CaWO_4$, $SrMoO_4$, $YAlO_3$ (YAP), $Y_3Al_5O_{12}$ (YAG), $Y_2SiO_5$, $YP_5O_{14}$, $LaP_5O_{14}$, $LuAlO_3$, $LaCl_3$, $LaBr_3$, $PrBr_3$, or the like may be used.

The period of the periodic domain-inverted structure in the optical wavelength conversion element 16 may not necessarily be the first order period for the wavelength of the fundamental harmonic. Instead, the second or third order period may be used. For example, the third order period for the wavelength of 720 nm is 4.95 micrometers.

The optical wavelength conversion element 16 may not be a type which has the periodic domain-inverted structure. Instead, the optical wavelength conversion element 16 may be a type which is made of $\beta$-$BaBO_3$, LBO, CLBO, GdYCOB, YCOB, or the like.

The pumping laser diodes may not be the broad-area type. Instead, the laser diodes may be types which include a MOPA (master oscillator power amplifier) or $\alpha$-DFB (distributed feedback) structure.

Third Embodiment

Figure 3:
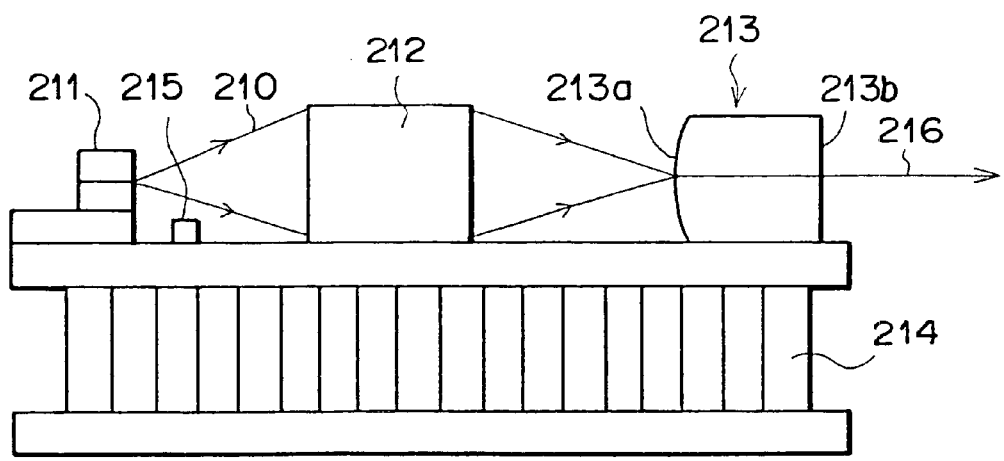
FIG. 3 is a side view illustrating an outline of the construction of the laser-diode-pumped solid-state laser apparatus as a third embodiment of the present invention.

FIG. 3 is a side view illustrating an outline of the construction of the laser-diode-pumped solid-state laser apparatus as the third embodiment of the present invention.

The laser-diode-pumped solid-state laser apparatus of FIG. 3 comprises a laser diode 211, a condenser lens 212, and a solid-state laser medium 213. The laser diode 211 emits a laser beam 210 as pumping light, where the laser beam 210 is a divergent light beam. The condenser lens 212 condenses the laser beam 210. The solid-state laser medium 213 is a $Pr^{3+}$-and-$Er^{3+}$-codoped $LiYF_4$ crystal (i.e., $Pr^{3+}:Er^{3+}:YLF$ crystal). The laser diode 211 is a broad-area type InGaN laser diode, which oscillates at the wavelength of 410 nm.

The above elements 211 to 213 are fixed on a Peltier element 214, and a thermistor 215 is attached to the Peltier element 214 for detecting a temperature. The output of the thermistor 215 is supplied to a temperature control circuit (not shown). Thus, the operation of the Peltier element 214 is controlled based on the output of the temperature control circuit so that the laser diode 211, the condenser lens 212, and the $Pr^{3+}:Er^{3+}:YLF$ crystal 213 are maintained at a predetermined temperature.

The backward end surface 213a of the $Pr^{3+}:Er^{3+}:YLF$ crystal 213 is a light entrance plane, and is coated so as to have a high transmittance (i.e., 80% or higher) at the wavelength of 410 nm, and efficiently pass therethrough the laser beam 210 from the laser diode 211. In addition, the reflectance of the backward end surface 213a at the wavelength of 479 nm is high, where the wavelength of 479 nm corresponds to one of the oscillation peaks of $Pr^{3+}$. For example, the reflectance of the backward end surface 213a at the wavelength of 479 nm is 99% or higher, and preferably 99.9% or higher. Further, the reflectances of the backward end surface 213a at the wavelengths of the other oscillation peaks of $Pr^{3+}$ (i.e., in the wavelength ranges of 528 nm, and 600 to 650 nm) are low. For example, the reflectances in the wavelength ranges of 528 nm, and 600 to 650 nm, are 60% or lower, and preferably 30% or lower.

The forward end surface 213b of the $Pr^{3+}:Er^{3+}:YLF$ crystal 213 is coated so as to have a transmittance of 1% (i.e., a reflectance of 99%) at the wavelength of 479 nm, and low reflectances (i.e., 60% or lower, and preferably 30% or lower) in the wavelength ranges of 528 nm, and 600 to 650 nm.

The laser beam 210 which is emitted from the laser diode 211, has a wavelength of 410 nm, and enters the $Pr^{3+}:Er^{3+}:YLF$ crystal 213 through the backward end surface 213a. In the $Pr^{3+}:Er^{3+}:YLF$ crystal 213, $Er^{3+}$ is pumped by the laser beam 210, and the excited electrons move to excited levels of $Pr^{3+}$. Thus, the $Pr^{3+}:Er^{3+}:YLF$ crystal 213 generates light having wavelengths corresponding to transitions between energy levels of $Pr^{3+}$, and the wavelengths of the generated light includes the wavelength of 479 nm, which is considered to be generated by a transition from $^3P_0$ to $^3H_4$. In this embodiment, laser oscillation at the wavelength of 479 nm occurs in a resonator which is constituted by the forward and backward end surfaces 213b and 213a of the $Pr^{3+}:Er^{3+}:YLF$ crystal 213, and a blue laser beam 216 having the wavelength of 479 nm is generated. The blue laser beam 216 exits through the forward end surface 213b. Since the forward and backward end surfaces 213b and 213a of the $Pr^{3+}:Er^{3+}:YLF$ crystal 213 are coated as described before, the oscillations at the wavelengths of the other oscillation peaks of $Pr^{3+}$, i.e., in the wavelength ranges of 528 nm, and 600 to 650 nm, are suppressed.

Since the wavelength of 410 nm is in the wavelength range in which the output power of the InGaN-based compound laser diodes is maximized, the amount of the laser beam 210 absorbed by the $Pr^{3+}:Er^{3+}:YLF$ crystal 213 becomes great, and high efficiency and high output power are achieved. Actually, the applicant has obtained 50 mW as the output power of the blue laser beam 216 when the output power of the laser diode 211 is 600 mW in the construction of FIG. 3.

On the other hand, in the case where a YLF crystal which is doped with only $Pr^{3+}$, i.e., a $Pr^{3+}:YLF$ crystal, is used, instead of the $Pr^{3+}:Er^{3+}:YLF$ crystal 213, and pumped with a laser beam which is emitted from the InGaN-based compound laser diode 211, the output power of the blue laser beam actually obtained from the $Pr^{3+}:YLF$ crystal is at most 1 mW when pumping light has a wavelength of 444 nm and output power of 600 mW.

Fourth Embodiment

Figure 4:
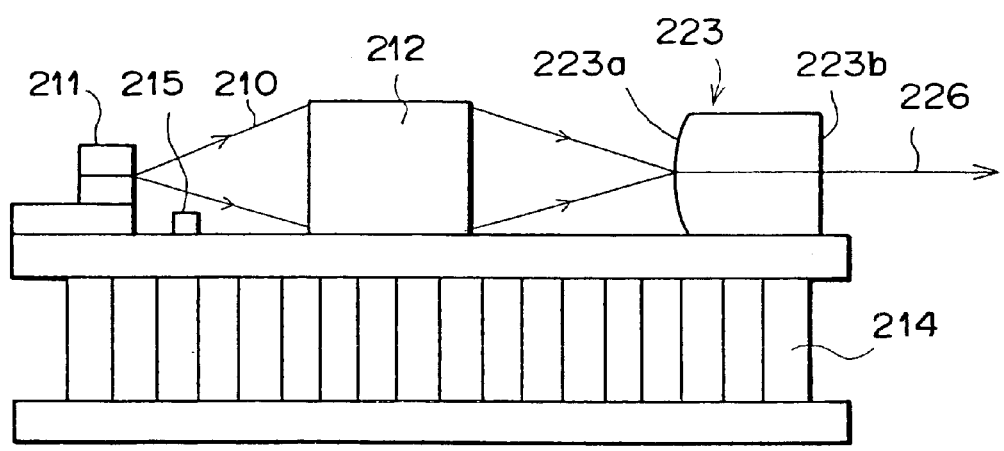
FIG. 4 is a side view illustrating an outline of the construction of the laser-diode-pumped solid-state laser apparatus as a fourth embodiment of the present invention.

FIG. 4 is a side view illustrating an outline of the construction of the laser-diode-pumped solid-state laser apparatus as the fourth embodiment of the present invention. In FIG. 4, elements having the same reference numbers as FIG. 3 have the same functions as the corresponding elements in FIG. 3.

In the laser-diode-pumped solid-state laser apparatus of FIG. 4, a $Pr^{3+}$-and-$Er^{3+}$-codoped $LiYF_4$ crystal (i.e., $Pr^{3+}:Er^{3+}:YLF$ crystal) is used as the solid-state laser medium 223.

The backward end surface 223a of the $Pr^{3+}:Er^{3+}:YLF$ crystal 223 is a light entrance plane, and is coated so as to have a high transmittance (i.e., 80% or higher) at the wavelength of 410 nm, and efficiently pass therethrough the light from the laser diode 211. In addition, the reflectance of the backward end surface 223a at the wavelength of 528 nm is high, where the wavelength of 528 nm corresponds to one of the oscillation peaks of $Pr^{3+}$. For example, the reflectance of the backward end surface 223a at the wavelength of 528 nm is 99% or higher, and preferably 99.9% or higher. Further, the reflectances of the backward end surface 223a at the wavelengths of the other oscillation peaks of $Pr^{3+}$ (i.e., in the wavelength ranges of 479 nm, and 600 to 650 nm) are low. For example, the reflectances in the wavelength ranges of 479 nm, and 600 to 650 nm, are 60% or lower, and preferably 30% or lower.

The forward end surface 223b of the $Pr^{3+}:Er^{3+}:YLF$ crystal 223 is coated so as to have a transmittance of 1% (i.e., a reflectance of 99%) at the wavelength of 528 nm, and low reflectances (i.e., 60% or lower, and preferably 30% or lower) in the wavelength ranges of 479 nm, and 600 to 650 nm.

The laser beam 210 which is emitted from the laser diode 211, has a wavelength of 410 nm, and enters the $Pr^{3+}:Er^{3+}:YLF$ crystal 223 through the backward end surface 223a. In the $Pr^{3+}:Er^{3+}:YLF$ crystal 223, $Er^{3+}$ is pumped by the laser beam 210, and the excited electrons move to excited levels of $Pr^{3+}$. Thus, the $Pr^{3+}:Er^{3+}:YLF$ crystal 223 generates light having wavelengths corresponding to transitions between energy levels of $Pr^{3+}$, and the wavelengths of the generated light includes the wavelength of 528 nm, which is considered to be generated by a transition from $^3P_1$ to $^3H_5$. In this embodiment, laser oscillation at the wavelength of 528 nm occurs in a resonator which is constituted by the forward and backward end surfaces 223b and 223a of the $Pr^{3+}:Er^{3+}:YLF$ crystal 223, and a green laser beam 226 having the wavelength of 528 nm is generated. The green laser beam 226 exits through the forward end surface 223b. Since the forward and backward end surfaces 223b and 223a of the $Pr^{3+}:Er^{3+}:YLF$ crystal 223 are coated as described before, the oscillations at the wavelengths of the other oscillation peaks of $Pr^{3+}$, i.e., in the wavelength ranges of 479 nm, and 600 to 650 nm, are suppressed.

Since the wavelength of 410 nm is in the wavelength range in which the output power of the InGaN-based compound laser diodes is maximized, the amount of the laser beam 210 absorbed by the $Pr^{3+}:Er^{3+}:YLF$ crystal 223 becomes great, and high efficiency and high output power are achieved. Actually, the applicant has obtained 100 mW as the output power of the green laser beam 226 when the output power of the laser diode 11 is 600 mW in the construction of FIG. 4.

On the other hand, in the case where a YLF crystal which is doped with only $Pr^{3+}$, i.e., a $Pr^{3+}:YLF$ crystal, is used, instead of the $Pr^{3+}:Er^{3+}:YLF$ crystal 223, and pumped with a laser beam which is emitted from the InGaN-based compound laser diode 211, the output power of the green laser beam actually obtained from the $Pr^{3+}:YLF$ crystal is at most 10 mW when pumping light has a wavelength of 444 nm and output power of 600 mW.

Variations of Third and Fourth Embodiments

Although the active layers of the laser diodes in the constructions of FIGS. 3 and 4 are made of InGaN-based compound materials, instead, laser diodes having an active layer made of an InGaNAs-based compound material or a GaNAs-based compound material may be used as a pumping light source. In particular, when an absorption band of a solid-state laser crystal is located on the longer wavelength side of the output wavelength of the laser diode, it is preferable to use the InGaNAs-based or GaNAs-based compound material, since the wavelength of the laser oscillation in the InGaNAs-based or GaNAs-based compound laser diode can be lengthened more easily than that in the InGaN-based compound laser diode. Thus, the absorption efficiency can be enhanced by use of the InGaNAs-based or GaNAs-based compound laser diode.

Although the blue and green laser beams are emitted by the constructions of FIGS. 3 and 4, respectively, it is possible to emit a red laser beam in the wavelength range of 600 to 660 nm by appropriately arranging the transmittances and reflectances of the $Pr^{3+}:Er^{3+}:YLF$ crystal 213 or 223.

Although the solid-state laser crystals in the constructions of FIGS. 3 and 4 are YLF crystals, instead, $BaY_2F_8$, $Ba(Y, Yb)_2F_8$, $LaF_3$, $Ca(NbO_3)_2$, $CaWO_4$, $SrMoO_4$, $YAlO_3$ (YAP), $Y_3Al_5O_{12}$(YAG), $Y_2SiO_5$, $YP_5O_{14}$, $LaP_5O_{14}$, $LuAlO_3$, $LaCl_3$, $LaBr_3$, $PrBr_3$, $YVO_4$, $GdVO_4$ or the like may be used.

Fifth Embodiment

Figure 5:
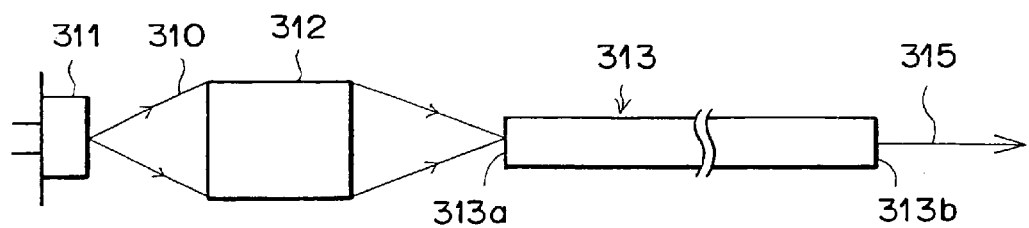
FIG. 5 is a side view illustrating an outline of the construction of the fiber laser apparatus as a fifth embodiment of the present invention.

FIG. 5 is a side view illustrating an outline of the construction of the fiber laser apparatus as the fifth embodiment of the present invention.

The fiber laser apparatus of FIG. 5 comprises a laser diode 311, a condenser lens 312, and an optical fiber 313. The laser diode 311 emits a laser beam 310 as pumping light, where the laser beam 310 is a divergent light beam. The condenser lens 312 condenses the laser beam 310. The optical fiber 313 has a core 320 which is codoped with $Pr^{3+}$ and $Er^{3+}$.

The laser diode 311 in the construction of FIG. 5 is a broad-area type semiconductor laser device, which has an InGaN active layer, and oscillates at the wavelength of 410 nm.

Figure 6:
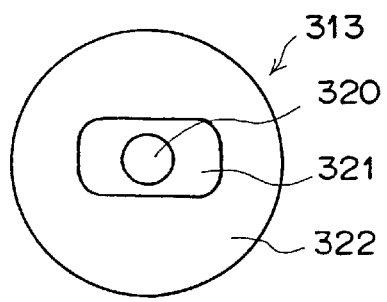
FIG. 6 is a crosssectional view illustrating the construction of the optical fiber used in the fiber laser apparatus of FIG. 5.

FIG. 6 is a crosssectional view illustrating the construction of the optical fiber used in the fiber laser apparatus of FIG. 5. As illustrated in FIG. 6, the optical fiber 313 comprises the core 320, and first and second claddings 321 and 322. The first cladding 321 is arranged around the core 320, and the second cladding 322 is arranged around the first cladding 321. The cross-sectional shape of each of the core 320 and the second cladding 322 is a true circle, and the cross-sectional shape of the first cladding 321 is nearly a rectangle.

The core 320 is made of a zirconium-based fluoride glass, e.g., ZBLANP ($ZrF_4$—$BaF_2$—$LaF_3$—$AlF_3$—$AlF_3$—$NaF$—$PbF_2$), the first cladding 321 is made of, for example, ZBLAN ($ZrF_4$—$BaF_2$—$LaF_3$—$AlF_3$—$NaF$), and the second cladding 322 is made of, for example, polymer. The core 320 may be made of ZBLAN, or fluoride glasses based on indium and gallium. For example, the core 320 may be made of IGPZCL, i.e., ($InF_3$—$GaF_3$—$LaF_3$)—($PbF_2$—$ZnF_2$)—CdF, or the like.

The laser beam 310 condensed by the condenser lens 312 enters the first cladding 321 of the optical fiber 313, and propagates through the first cladding 321 in a guided mode. That is, the first cladding 321 functions as a core for the laser beam 310. During the propagation, the laser beam 310 also passes through the core 320. In the core 320, $Er^{3+}$ is pumped by the laser beam 310, and the excited electrons move to excited levels of $Pr^{3+}$. Thus, the $Pr^{3+}$ generates fluorescence having wavelengths corresponding to transitions between energy levels of $Pr^{3+}$, and the wavelengths of the generated fluorescence includes the wavelength of 491 nm, which is considered to be generated by a transition from $^3P_0$ to $^3H_4$. The fluorescence having the wavelength of 491 nm propagates through the core 320 in a guided mode. In addition, in the core 320, which is made of ZBLANP, fluorescence having a wavelength of 520 nm, which is considered to correspond to a transition from $^3P_1$ to $^3H_1$, fluorescence having a wavelength of 605 nm, which is considered to correspond to a transition from $^3P_0$ to $^3F_2$, and fluorescence having a wavelength of 635 nm, which is considered to correspond to a transition from $^3P_0$ to $^3F_3$ may also be generated.

The light entrance end surface 313a of the optical fiber 313 is coated so as to be highly reflective at the wavelength of 491 nm, and antireflective at the wavelengths of 410, 520, 605, and 635 nm. The light exit end surface 313b of the optical fiber 313 is coated so as to transmit only 1% of the light having a wavelength of 491 nm.

In the above configuration, the above fluorescence having the wavelength of 491 nm resonates between the light entrance end surface 313a and the light exit end surface 313b of the optical fiber 313, i.e., laser oscillation occurs at the wavelength of 491 nm. Thus, a blue-green laser beam 315 having the wavelength of 491 nm is generated in the optical fiber 313, and exits from the light exit end surface 313b of the optical fiber 313 to the forward side of the fiber laser apparatus of FIG. 5.

In this example, the laser beam 315 propagates through the core 320 in a single mode, and the laser beam 310 propagates through the first cladding 321 in multiple modes. Therefore, it is possible to use a high-power, broad-area type laser diode as a pumping light source, and the laser beam from the high-power, broad-area type laser diode can enter the optical fiber 313 with high coupling efficiency.

In addition, since the cross-sectional shape of the first cladding 321 is nearly a rectangle, the laser beam 310 propagates through irregular reflection paths within the first cladding 321, and therefore the probability of the entrance of the laser beam 310 into the core 320 is enhanced.

Further, since the wavelength of 410 nm is in the wavelength range in which the output power of the InGaN-based compound laser diodes is maximized, the amount of the laser beam 310 absorbed by the optical fiber 313 becomes great, and high efficiency and high output power are achieved. Actually, the applicant has obtained 300 mW as the output power of the blue-green laser beam 315 when the output power of the laser diode 311 is 2 W, and the length of the optical fiber 313 is 0.5 m in the construction of FIG. 5.

On the other hand, in the case where an optical fiber is doped with only $Pr^{3+}$, instead of being codoped with the $Pr^{3+}$ and $Er^{3+}$, the maximum output power of the blue-green laser beam actually obtained from the $Pr^{3+}$-single doped optical fiber is at most 100 mW when the $Pr^{3+}$-single doped optical fiber is pumped with an InGaN laser diode which oscillates at the wavelength of 444 nm. In this case, it is difficult to obtain such a high output power as with the construction of FIG. 5, in which the InGaN laser diode oscillates at the wavelength of 410 nm. Actually, the above maximum output power of the blue-green laser beam is obtained with a pumping power of 1 W.

Sixth Embodiment

Figure 7:
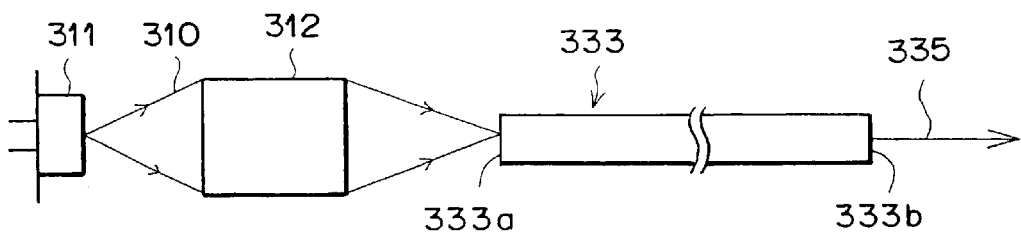
FIG. 7 is a side view illustrating an outline of the construction of the fiber laser apparatus as a sixth embodiment of the present invention.

FIG. 7 is a side view illustrating an outline of the construction of the fiber laser apparatus as the sixth embodiment of the present invention.

The fiber laser apparatus of FIG. 7 is different, from the fiber laser apparatus of FIG. 5, in the transmittances and reflectances of the coatings of the light entrance end surface 333a and the light exit end surface 333b of the optical fiber 333.

The light entrance end surface 333a of the optical fiber 333 is coated so as to be highly reflective at the wavelength of 520 nm, and antireflective at the wavelengths of 410, 491, 605, and 635 nm. The light exit end surface 333b of the optical fiber 333 is coated so as to transmit only 2% of the light having a wavelength of 520 nm.

In the above configuration, the aforementioned fluorescence having the wavelength of 520 nm resonates between the light entrance end surface 333a and the light exit end surface 333b of the optical fiber 333, i.e., laser oscillation occurs at the wavelength of 520 nm. Thus, a green laser beam 335 having the wavelength of 520 nm is generated in the optical fiber 333, and exits from the light exit end surface 333b of the optical fiber 333 to the forward side of the fiber laser apparatus of FIG. 7.

Actually, the applicant has obtained 500 mW as the output power of the green laser beam 335 when the output power of the laser diode 311 is 2 W, and the length of the optical fiber 333 is 1.0 m in the construction of FIG. 7.

Seventh Embodiment

Figure 8:
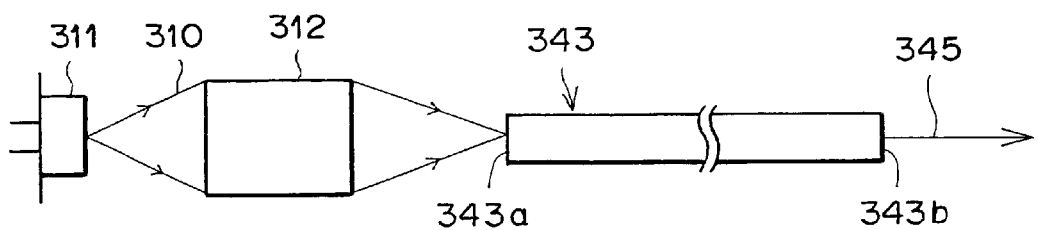
FIG. 8 is a side view illustrating an outline of the construction of the fiber laser apparatus as a seventh embodiment of the present invention.

FIG. 8 is a side view illustrating an outline of the construction of the fiber laser apparatus as the seventh embodiment of the present invention.

The fiber laser apparatus of FIG. 8 is different, from the fiber laser apparatus of FIG. 5, in the transmittances and reflectances of the coatings of the light entrance end surface 333a and the light exit end surface 343b of the optical fiber 343.

The light entrance end surface 343a of the optical fiber 343 is coated so as to be highly reflective at the wavelength of 635 nm, and antireflective at the wavelengths of 410, 491, 520, and 605 nm. The light exit end surface 343b of the optical fiber 343 is coated so as to transmit only 3.5% of the light having a wavelength of 635 nm.

In the above configuration, the aforementioned fluorescence having the wavelength of 635 nm resonates between the light entrance end surface 343a and the light exit end surface 343b of the optical fiber 343, i.e., laser oscillation occurs at the wavelength of 635 nm. Thus, a red laser beam 345 having the wavelength of 635 nm is generated in the optical fiber 343, and exits from the light exit end surface 343b of the optical fiber 343 to the forward side of the fiber laser apparatus of FIG. 8.

Actually, the applicant has obtained 1 W as the output power of the red laser beam 345 when the output power of the laser diode 311 is 2 W, and the length of the optical fiber 343 is 1.0 m in the construction of FIG. 8.

Eighth Embodiment

Figure 9:
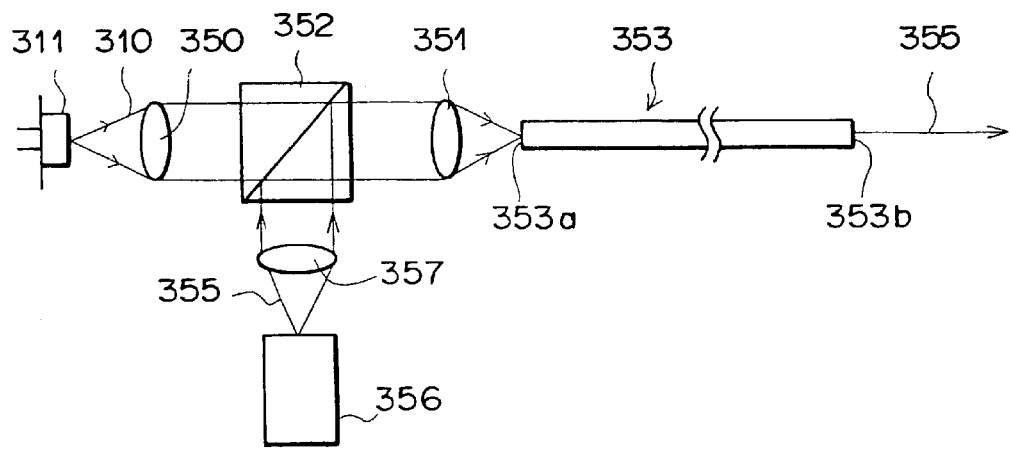
FIG. 9 is a side view illustrating an outline of the construction of the fiber laser amplifier as an eighth embodiment of the present invention.

FIG. 9 is a side view illustrating an outline of the construction of the fiber laser amplifier as the eighth embodiment of the present invention. In FIG. 9, elements having the same reference numbers as FIG. 5 have the same functions as the corresponding elements in FIG. 5.

The fiber laser apparatus of FIG. 9 comprises a laser diode 311, a collimator lens 350, a condenser lens 351, a beam splitter 352, an optical fiber 353, an SHG (second harmonic generation) laser unit 356, and another collimator lens 357. The laser diode 311 emits a laser beam 310 having the wavelength of 410 nm, as pumping light, where the laser beam 310 is a divergent light beam. The collimator lens 350 collimates the laser beam 310. The beam splitter 352 is arranged between the collimator lens 350 and the condenser lens 351, and the laser beam 310 collimated by the collimator lens 350 passes through the beam splitter 352. The condenser lens 351 condenses the collimated laser beam 310, and the condensed laser beam 310 enters the optical fiber 353.

The SHG laser unit 356 is provided for emitting a laser beam 355 having a wavelength of 520 nm. Although not shown, the SHG laser unit 356 includes a DBR (distributed Bragg reflection) type laser diode and an optical waveguide. The DBR type laser diode is provided as a light source of a fundamental wave, and emits a laser beam having a wavelength of 1,040 nm. The optical waveguide is provided as a wavelength conversion element, which is made of a nonlinear optical material, and has periodic domain-inverted structure. In the SHG laser unit 356, the wavelength of the laser beam emitted from the DBR type laser diode is reduced by half by the optical waveguide, and the laser beam 355 having the wavelength of 520 nm is generated.

The laser beam 355 is collimated by the collimator lens 357, and enters the beam splitter 352, in which the collimated laser beam 355 is reflected toward the condenser lens 351, is condensed by the condenser lens 351, and enters the optical fiber 353 together with the laser beam 310 from the laser diode 311.

The optical fiber 353 has basically the same construction as the optical fiber 313 in FIG. 5, except that the coatings of the light entrance end surface 353a and the light exit end surface 353b of the optical fiber 353 are antireflective at the above-mentioned wavelengths of 410 and 520 nm.

In the optical fiber 353, fluorescence having the wavelength of 520 nm is generated by the pumping of $Er^{3+}$, the generation of the excited level of $Pr^{3+}$, and the transition in $Pr^{3+}$, in the same manner as the fifth embodiment. Since the wavelength of the above fluorescence is the same as that of the laser beam 355 from the SHG laser unit 356, the laser beam 355 is amplified in the optical fiber 353 by receiving the energy of the fluorescence, and the amplified laser beam 355' is emitted from the light exit end surface 353b to the forward side of the fiber laser amplifier of FIG. 9.

Actually, the applicant has obtained 500 mW as the output power of the laser beam 355' when the output power of the SHG laser unit 356 is 10 mW in the construction of FIG. 9.

In addition, it is possible to modulate the laser beam 355' by providing the DBR laser diode in the SHG laser unit 356, with a function of modulation of the laser beam 355.

Variations of Fifth and Eighth Embodiments

Although the active layers of the laser diodes used as pumping light sources in the constructions of FIGS. 5, 7, 8 and 9 are made of InGaN materials, instead, laser diodes having an active layer made of an InGaNAs-based or GaNAs-based compound material may be used as a pumping light source. In particular, when an absorption band of a solid-state laser crystal is located on the longer wavelength side of the output wavelength of the laser diode, it is preferable to use the InGaNAs-based or GaNAs-based compound material, since the wavelength of the laser oscillation in the InGaNAs-based or GaNAs-based compound laser diode can be lengthened more easily than that in the InGaN-based laser diode. Thus, the absorption efficiency can be enhanced by use of the InGaNAs-based or GaNAs-based compound laser diode.

In addition, all of the contents of the Japanese Patent Applications Nos. 11(1999)-206573, 11(1999)-206816 and 11(1999)-206817 are incorporated into this specification by reference.

What is claimed is:

1. A laser-diode-pumped solid-state laser apparatus comprising:

a laser diode which has an active layer made of one of an InGaN, InGaNAs, and GaNAs materials, and emits a pumping laser beam;

a solid-state laser crystal which is doped with at least one rare-earth element including at least $Pr^{3+}$, and emits solid-state laser light when the solid-state laser crystal is pumped by said pumping laser beam; and an optical wavelength conversion element which converts said solid-state laser light into ultraviolet laser light by wavelength conversion.

2. A laser-diode-pumped solid-state laser apparatus according to claim 1, wherein said solid-state laser crystal is codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$.

3. A laser-diode-pumped solid-state laser apparatus according to claim 2, wherein said optical wavelength conversion element is made of a nonlinear optical crystal having a periodic domain-inverted structure.

4. A laser-diode-pumped solid-state laser apparatus according to claim 2, wherein said solid-state laser crystal emits a solid-state laser beam having a wavelength of about 720 nm by a transition from $^3P_0$ to $^3F_4$ in the solid-state laser crystal, and said ultraviolet light is a second harmonic of the solid-state laser light, and has a wavelength of about 360 nm.

5. A laser-diode-pumped solid-state laser apparatus according to claim 4, wherein said optical wavelength conversion element is made of a nonlinear optical crystal having a periodic domain-inverted structure.

6. A laser-diode-pumped solid-state laser apparatus according to claim 1, wherein said solid-state laser crystal emits a solid-state laser beam having a wavelength of about 720 nm by a transition from $^3P_0$ to $^3F_4$ in the solid-state laser crystal, and said ultraviolet light is a second harmonic of the solid-state laser light, and has a wavelength of about 360 nm.

7. A laser-diode-pumped solid-state laser apparatus according to claim 4, wherein said optical wavelength conversion element is made of a nonlinear optical crystal having a periodic domain-inverted structure.

8. A laser-diode-pumped solid-state laser apparatus according to claim 1, wherein said optical wavelength conversion element is made of a nonlinear optical crystal having a periodic domain-inverted structure.

9. A laser-diode-pumped solid-state laser apparatus comprising:

a laser diode which has an active layer made of one of an InGaN, InGaNAs, and GaNAs materials, and emits a pumping laser beam; and a solid-state laser crystal which is codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, and emits solid-state laser light when the solid-state laser crystal is pumped by said pumping laser beam.

10. A laser-diode-pumped solid-state laser apparatus according to claim 9, wherein said solid-state laser light has a wavelength in a range of 465 to 495 nm.

11. A laser-diode-pumped solid-state laser apparatus according to claim 9, wherein said solid-state laser light has a wavelength in a range of 515 to 555 nm.

12. A laser-diode-pumped solid-state laser apparatus according to claim 9, wherein said solid-state laser light has a wavelength in a range of 600 to 660 nm.

13. A fiber laser apparatus comprising:

a GaN-based compound laser diode which emits a pumping laser beam; and an optical fiber which is codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, and emits laser light when the optical fiber is pumped by said pumping laser beam.

14. A fiber laser apparatus according to claim 13, wherein said laser light has a wavelength in a range of 465 to 495 nm.

15. A fiber laser apparatus according to claim 14, wherein said GaN-based compound laser diode has an active layer made of one of an InGaN, InGaNAs, and GaNAs materials.

16. A fiber laser apparatus according to claim 13, wherein said laser light has a wavelength in a range of 515 to 555 nm.

17. A fiber laser apparatus according to claim 16, wherein said GaN-based compound laser diode has an active layer made of one of an InGaN, InGaNAs, and GaNAs materials.

18. A fiber laser apparatus according to claim 13, wherein said laser light has a wavelength in a range of 600 to 660 nm.

19. A fiber laser apparatus according to claim 18, wherein said GaN-based compound laser diode has an active layer made of one of an InGaN, InGaNAs, and GaNAs materials.

20. A fiber laser apparatus according to claim 13, wherein said GaN-based compound laser diode has an active layer made of one of an InGaN, InGaNAs, and GaNAs materials.

21. A fiber laser amplifier comprising:

a GaN-based compound laser diode which emits a pumping laser beam; and an optical fiber which is codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$, generates fluorescence with at least one wavelength when the optical fiber is pumped by said pumping laser beam, and amplifies incident light which has a wavelength included in said at least one wavelength of said fluorescence.

22. A fiber laser amplifier according to claim 21, wherein said fluorescence has a wavelength in a range of 465 to 495 nm.

23. A fiber laser amplifier according to claim 22, wherein said GaN-based compound laser diode has an active layer made of one of an InGaN, InGaNAs, and GaNAs materials.

24. A fiber laser amplifier according to claim 21, wherein said fluorescence has a wavelength in a range of 515 to 555 nm.

25. A fiber laser amplifier according to claim 24, wherein said GaN-based compound laser diode has an active layer made of one of an InGaN, InGaNAs, and GaNAs materials.

26. A fiber laser amplifier according to claim 21, wherein said fluorescence has a wavelength in a range of 600 to 660 nm.

27. A fiber laser amplifier according to claim 26, wherein said GaN-based compound laser diode has an active layer made of one of an InGaN, InGaNAs, and GaNAs materials.

28. A fiber laser amplifier according to claim 21, wherein said GaN-based compound laser diode has an active layer made of one of an InGaN, InGaNAs, and GaNAs materials.

* * * * *